United States Patent
Jung et al.

(10) Patent No.: US 9,728,235 B2
(45) Date of Patent: Aug. 8, 2017

(54) SEMICONDUCTOR DEVICE AND SEMICONDUCTOR MEMORY DEVICE

(75) Inventors: Taehyung Jung, San Jose, CA (US); Kwanweon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 1266 days.

(21) Appl. No.: 13/551,147

(22) Filed: Jul. 17, 2012

(65) Prior Publication Data
US 2014/0022856 A1    Jan. 23, 2014

(51) Int. Cl.
| G01R 31/28 | (2006.01) |
| G11C 7/10 | (2006.01) |
| G11C 16/20 | (2006.01) |
| G11C 29/00 | (2006.01) |
| G11C 29/44 | (2006.01) |

(52) U.S. Cl.
CPC ............ *G11C 7/1006* (2013.01); *G11C 16/20* (2013.01); *G11C 29/785* (2013.01); *G11C 29/82* (2013.01); *G11C 2029/4402* (2013.01)

(58) Field of Classification Search
CPC ...................... G11C 7/1006; G11C 2029/4402
See application file for complete search history.

(56) References Cited

U.S. PATENT DOCUMENTS

| 6,667,902 | B2 | 12/2003 | Peng |
| 6,777,757 | B2 | 8/2004 | Peng et al. |
| 6,904,751 | B2 | 6/2005 | Makki et al. |
| 7,173,851 | B1 | 2/2007 | Callahan et al. |
| 7,269,047 | B1 | 9/2007 | Fong et al. |
| 2011/0153910 | A1* | 6/2011 | MacKenna et al. ........... 711/103 |
| 2012/0191388 | A1* | 7/2012 | Parle ............................... 702/63 |

* cited by examiner

*Primary Examiner* — Sam Rizk
(74) *Attorney, Agent, or Firm* — IP & T Group LLP (57) ABSTRACT

A semiconductor device includes a non-volatile memory unit, a data line configured to transfer data sequentially outputted from the non-volatile memory unit, and a shift register unit configured to include a plurality of registers that shift and store the data transferred through the data line in synchronization with a clock. The semiconductor device includes a non-volatile memory unit having an e-fuse array, and transfers the data stored in an e-fuse array to other constituent elements of the semiconductor device that use the data of the e-fuse array in order to have the data stored in the e-fuse array, including diverse setup information and repair information.

13 Claims, 5 Drawing Sheets

SEMICONDUCTOR DEVICE AND SEMICONDUCTOR MEMORY DEVICE

BACKGROUND

1. Field

Exemplary embodiments of the present invention relate to a semiconductor device, and more particularly, to a technology for transferring data stored in a non-volatile memory device of a semiconductor device to other constituent elements of the semiconductor device.

2. Description of the Related Art

Figure 1:
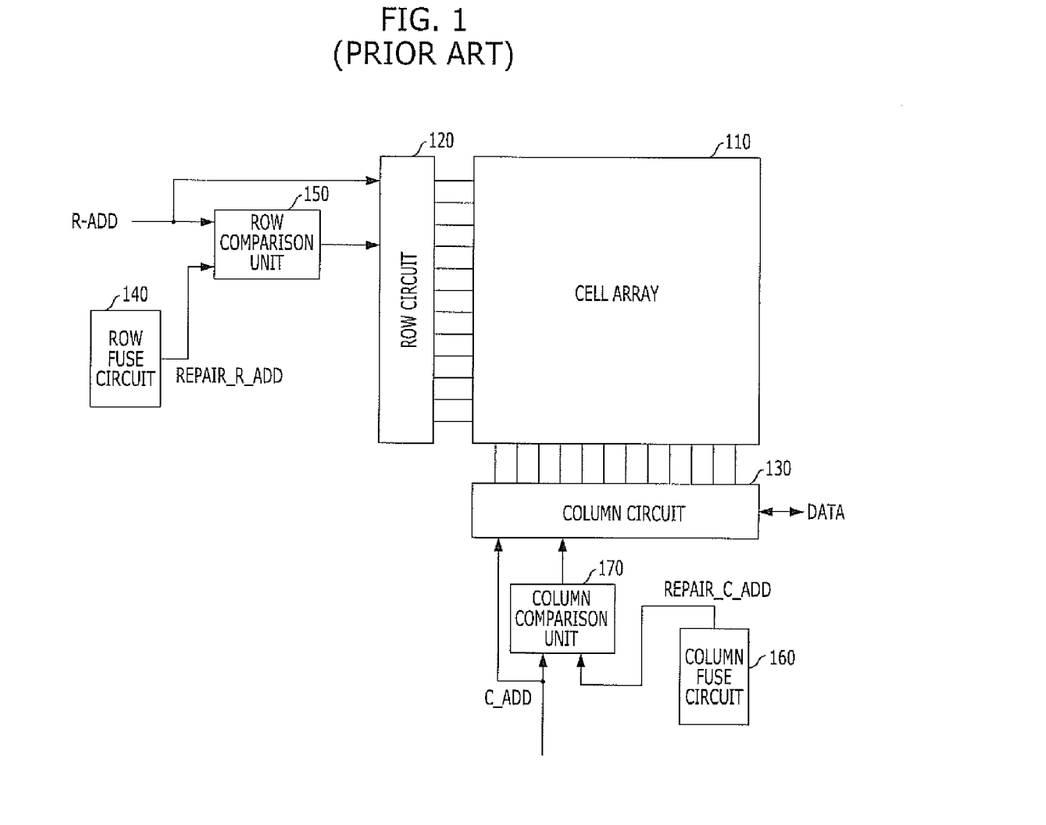
FIG. 1 is a block diagram illustrating a repair operation of a conventional memory device.

FIG. 1 is a block diagram illustrating a repair operation of a conventional memory device.

Referring to FIG. 1, the memory device includes a cell array 110, a row circuit 120, and a column circuit 130. The cell array 110 includes a plurality of memory cells. The row circuit 120 enables a word line that is selected based on a row address R_ADD. The column circuit 130 accesses, for example, 'reads' or 'writes', a data of a bit line that is selected based on a column address C_ADD.

A row fuse circuit 140 stores a row address corresponding to a failure memory cell of the cell array 110 by a repair row address REPAIR_R_ADD. A row comparison unit 150 compares the repair row address REPAIR_R_ADD stored in the row fuse circuit 140 with the row address R_ADD inputted from the outside of the memory device. If the repair row address REPAIR_R_ADD and the row address R_ADD are the same, the row comparison unit 150 controls the row circuit 120 to enable a redundancy word line instead of the word line designated by the row address R_ADD.

A column fuse circuit 160 stores a column address corresponding to a failure memory cell of the cell array 110 by a repair column address REPAIR_C_ADD. A column comparison unit 170 compares the repair column address REPAIR_C_ADD stored in the column fuse circuit 160 with the column address C_ADD inputted from the outside of the memory device. If the repair column address REPAIR_C_ADD and the column address C_ADD are the same, the column comparison unit 170 controls the column circuit 130 to enable a redundancy bit line instead of the bit line designated by the column address C_ADD.

The row fuse circuit 140 and the column fuse circuit 160 shown in FIG. 1 use a laser fuse. The laser fuse stores a data of a logic high level or a logic low level according to whether the fuse is cut or not. The laser fuse may be programmed in the stage of forming wafer, but after the wafer is mounted on a package, the laser fuse cannot be programmed. Also, the laser fuse may not be designed to be small due to technical limitation of pitch. To address such a feature, an e-fuse may be used, where the e-fuse may be formed of a transistor or a capacitor resistor. When the e-fuse is formed of a transistor, the e-fuse stores a data by changing the resistance between a gate and a drain/source.

Figure 2:
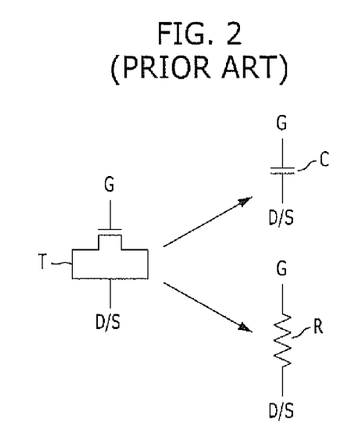
FIG. 2 illustrates an e-fuse that is formed of a transistor being operating as a resistor or a capacitor.

FIG. 2 a schematic diagram illustrating an e-fuse formed of a transistor operating as a resistor or a capacitor.

Referring to FIG. 2, the e-fuse is formed of a transistor T, and when a power source voltage of an ordinary level that the transistor T may endure is applied to a gate G, the e-fuse operates as a capacitor C. Therefore, no current flows between the gate G and the drain D or source S. On the other hand, when a power source voltage of a high level that the transistor T may not endure is applied to a gate G, the gate oxide of the transistor T is destroyed and the gate G and the drain D-source S is shorted and the e-fuse operates as a resistor R. Therefore, current comes to flow between the gate G and the drain D-source S.

The data of the e-fuse is recognized from the resistance between the gate G and the drain D-source S of the e-fuse based on the above-described phenomenon. In detecting the data of the e-fuse, (1) the data may be directly recognized without performing an additional sensing operation by using a large size of the transistor T or (2) the data of the e-fuse may be recognized by using an amplifier to sense the current flowing through the transistor T instead of reducing the size of the transistor T. In using either method, substantial space is used in that the size of the transistor T used for the e-fuse is to be large or an amplifier for amplifying the data for each e-fuse is to be used.

Due to the large space used in implementing methods, it is not easy to apply the e-fuse to the row fuse circuit 140 and the column fuse circuit 160 shown in FIG. 1. To address such features, U.S. Pat. Nos. 6,904,751, 6,777,757, 6,667,902, 7,173,851, and 7,269,047 discloses a method of forming e-fuses in the form of an array and performing a repair operation by using the data stored in the e-fuse array. When the e-fuses are formed as an array, the total area may be reduced because amplifiers may be shared by the e-fuses

SUMMARY

An embodiment of the present invention is directed to a semiconductor device that includes a non-volatile memory device, such as an e-fuse array and may transfer the data stored in an e-fuse array to other constituent elements of the semiconductor device that use the data of the e-fuse array in order to have the data stored in the e-fuse array, such as diverse setup information and repair information.

Another embodiment of the present invention is directed to a scheme for transferring the data stored in the e-fuse array to other constituent elements of the semiconductor device in the semiconductor device.

In accordance with an exemplary embodiment of the present invention, a semiconductor device includes a non-volatile memory unit; a data line configured to transfer data sequentially outputted from the non-volatile memory unit, and a shift register unit configured including a plurality of registers configured to shift and store the data transferred through the data line in synchronization with a clock.

A predetermined data pattern may be transferred through the data line in an initial stage, and the semiconductor device may further include a verification unit configured to check the predetermined data pattern outputted from a last register of the shift register unit.

In accordance with another exemplary embodiment of the present invention, a semiconductor device includes a non-volatile memory unit, a data line configured to transfer data sequentially outputted from the non-volatile memory unit, a plurality of first registers configured to store data, a first internal circuit configured to use the data stored in the first registers, a plurality of second registers configured to store data, and a second internal circuit configured to use the data stored in the second registers, wherein the first registers and the second registers are coupled in a form of a shift register unit and shift and store the data transferred through the data line in synchronization with a clock.

In accordance with yet another exemplary embodiment of the present invention, a semiconductor memory device includes a non-volatile memory unit configured to store repair data, a data line configured to transfer data sequentially outputted from the non-volatile memory unit, a plurality of first registers to a plurality of $N^{th}$ registers configured to store data, and first to $N^{th}$ memory banks configured to replace a normal memory cell with a redundancy memory cell by using the data stored in the registers that correspond to the corresponding memory bank among the first registers to the $N^{th}$ registers, wherein the first registers to the $N^{th}$ registers are coupled in a form of a shift register unit and shift and store the data transferred through the data line in synchronization with a clock.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
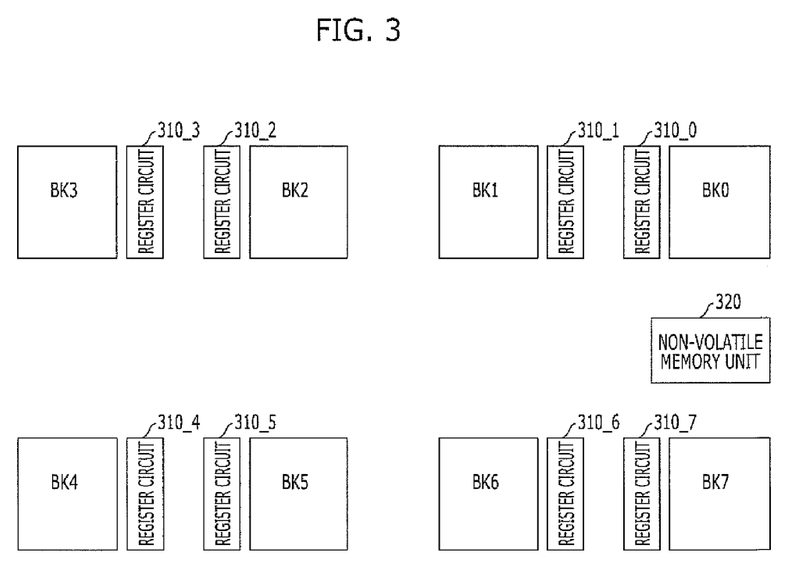
FIG. 3 illustrates a non-volatile memory unit for storing repair information in a semiconductor memory device in accordance with an embodiment of the present invention.

FIG. 3 illustrates a non-volatile memory unit for storing repair information in a semiconductor memory device in accordance with an embodiment of the present invention.

Referring to FIG. 3, the semiconductor memory device includes a plurality of memory banks BK0 to BK7, a plurality of register circuits 310_0 to 310_7, and the non-volatile memory unit 320. Each of the register circuit 310_0 to 310_7 is provided for each memory bank and stores a repair address.

The non-volatile memory unit 320 replaces conventional fuse circuits, such as the row fuse circuit 140 and the column fuse circuit 160 shown in FIG. 1. The non-volatile memory unit 320 stores repair information corresponding to all of the memory banks BK0 to BK7, which include repair addresses. The non-volatile memory unit 320 may be formed to include an e-fuse array or it may be formed of a non-volatile memory device, such as a flash memory device and an Electrically Erasable Programmable Read-Only Memory (EEPROM) device.

The register circuits 310_0 to 310_7 are respectively mounted on the memory banks BK0 to BK7 and store the repair information of a corresponding memory bank BK0 to BK7. A first register circuit 310_0 stores the repair information of a first memory bank BK0, and a fifth register circuit 310_4 stores the repair information of a fifth memory bank BK4. The register circuits 310_0 to 310_7 receive and store the repair information from the non-volatile memory unit 320 during the initialization operation of the semiconductor memory device. The register circuit includes a shift register which has a plurality of registers sequentially connected to each other.

Since the non-volatile memory unit 320 is formed in a type of an array, it takes some time to call the data stored in the non-volatile memory unit 320. Therefore, it is difficult to perform a repair operation by directly using the data stored in the non-volatile memory unit 320. For this reason, the data stored in the non-volatile memory unit 320 are transferred to the register circuits 310_0 to 310_7, and the data stored in the register circuits 310_0 to 310_7 are used for a repair operation.

For the data to be transferred from the non-volatile memory unit 320 to the register circuits 310_0 to 310_7, the addresses for designating the corresponding register circuits in which the data are to be stored among the multiple register circuits 310_0 to 310_7 have to be transferred along with the data to be stored in the register circuits 310_0 to 310_7. Hereafter, a scheme for transferring the data in accordance with an exemplary embodiment of the present invention is described.

Figure 4:
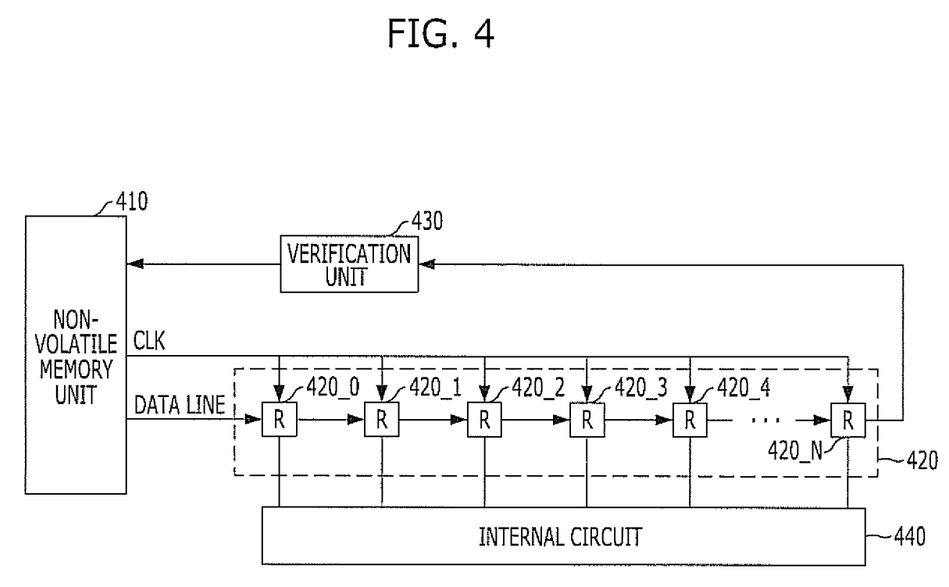
FIG. 4 is a block diagram showing a semiconductor device in accordance with an exemplary embodiment of the present invention.

FIG. 4 is a block diagram of a semiconductor device in accordance with an exemplary embodiment of the present invention.

Referring to FIG. 4, the semiconductor device includes a non-volatile memory unit 410, a shift register unit 420 including a plurality of registers 420_0 to 420_N sequentially connected to each other, a verification unit 430, and an internal circuit 440 that uses the information stored in the shift register unit 420.

The non-volatile memory unit 410 stores the data to be transferred to the registers 420_0 to 420_N. The data are transferred from the non-volatile memory unit 410 to the shift register unit 420 through a data line DATA LINE. A clock CLK is outputted from the non-volatile memory unit 410. The clock CLK is synchronized with the data transferred through the data line DATA LINE. The non-volatile memory unit 410 may be formed to include an e-fuse array or it may be formed of a non-volatile memory device, such as a flash memory device and an Electrically Erasable Programmable Read-Only Memory (EEPROM) device.

The registers 420_0 to 420_N of the shift register unit 420 are serially coupled with each other, and shift and store the data transferred through the data line DATA LINE in synchronization with the clock CLK. For example, when the clock CLK toggles for the first time, the first data transferred through the data line DATA LINE for the first time is stored in the first register 420_0. When the clock CLK toggles for the second time, the first data transferred through the data line DATA LINE for the first time, which was stored in the first register 420_0, is stored in the second register 420_1, and the second data transferred through the data line DATA LINE for the second time is stored in the first register 420_0. Each of the registers 420_0 to 420_N may be a D-flipflop.

The internal circuit 440 is a circuit that uses the data stored in the multiple registers 420_0 to 420_N for performing internal operations of the semiconductor device. For example, the internal circuit 440 may be a circuit for performing special operation using the data stored in the registers 420_0 to 420_N. Also, if the semiconductor device is a memory device, the internal circuit 440 may be a circuit that performs a repair operation by using the data stored in the registers 420_0 to 420_N.

The verification unit 430 verifies whether the data outputted from the non-volatile memory unit 410 are all stored in the multiple registers 420_0 to 420_N. The verification unit 430 may be omitted. As illustrated in FIG. 4, when there is a verification unit 430, no data to be stored in the registers 420_0 to 420_N are outputted from the non-volatile memory unit 410 from the first, and a predetermined data pattern is transferred in the initial stage. For example, a predetermined pattern of 4 bits, e.g., '1010', may be outputted from the non-volatile memory unit 410. The verification unit 430 receives a data that is outputted from the last register 420_N among the registers 420_0 to 420_N of the shift register unit 420. The verification unit 430 sees if the predetermined data pattern, e.g., '1010', is outputted from the last register 420_N and checks whether all the data are transferred from the non-volatile memory unit 410 to the registers 420_0 to 420_N. When it is decided that all the data are transferred from the non-volatile memory unit 410 to the registers 420_0 to 420_N, the verification unit 430 controls the non-volatile memory unit 410 to disable the clock CLK and stop outputting data. If it is decided that not all the data are transferred from the non-volatile memory unit 410 to the registers 420_0 to 420_N, the operation of transferring data from the non-volatile memory unit 410 to the registers 420_0 to 420_N is performed again.

Referring to FIG. 4, when the data of the non-volatile memory unit 410 are transferred to the registers 420_0 to 420_N, the clock CLK is transferred instead of an address, and the registers 420_0 to 420_N are coupled in the form of a shift register unit to shift and store the data outputted from the non-volatile memory unit 410 in synchronization with the clock CLK. Therefore, it does not need to transfer a multi-bit address from the non-volatile memory unit 410 to the registers 420_0 to 420_N, which leads to a significant decrease in the area of the semiconductor device.

FIG. 4 shows a case where there is one data line DATA LINE and one shift register unit 420. However, according to another embodiment of the present invention, there may be a plurality of data lines and the number of the shift register units may be substantially identical to the number of the data lines, and the internal circuit 440 may use data stored in the multiple shift register units.

Figure 5:
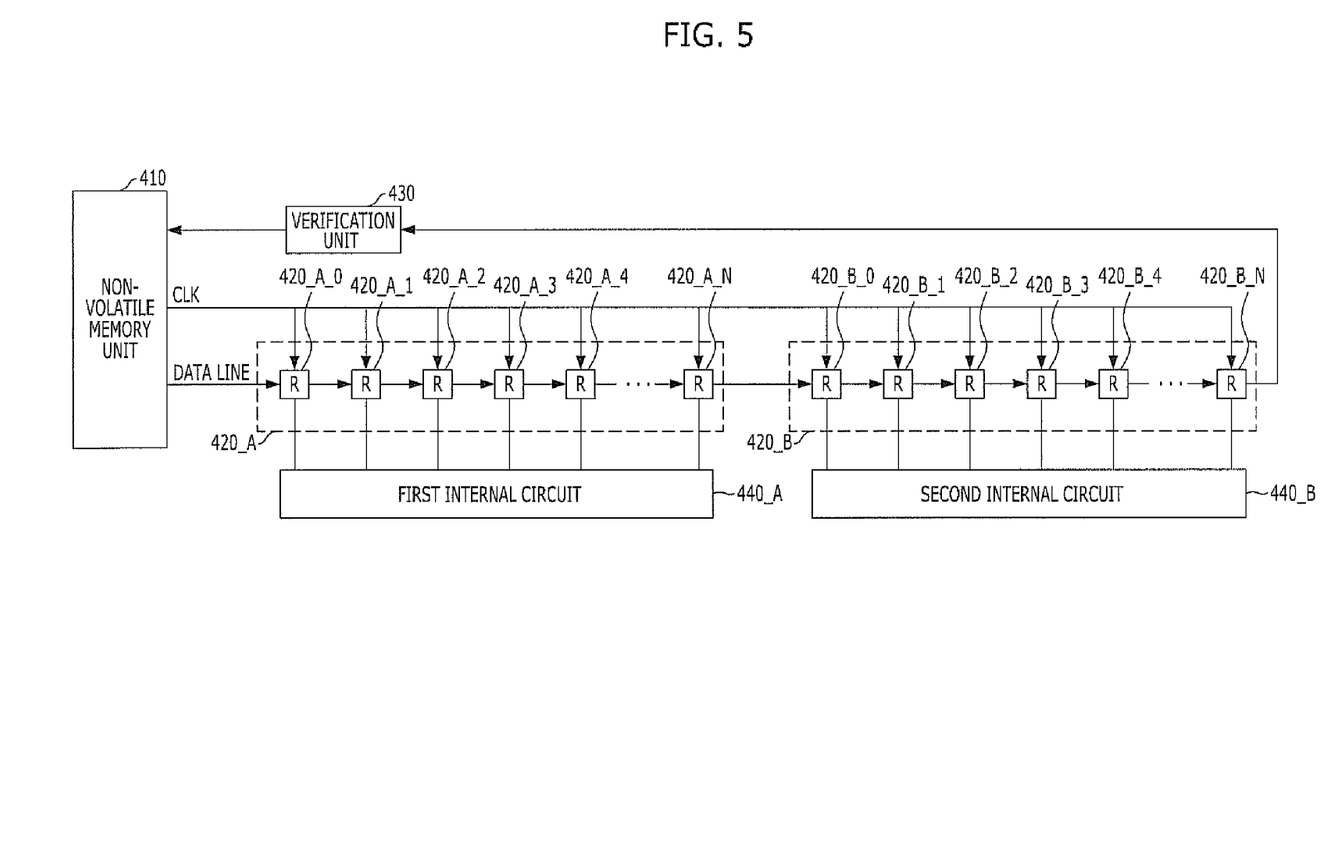
FIG. 5 is a block diagram illustrating a semiconductor device in accordance with another exemplary embodiment of the present invention.

FIG. 5 is a block diagram illustrating a semiconductor device in accordance with another exemplary embodiment of the present invention.

Referring to FIG. 5, a case where the data stored in a non-volatile memory unit of a chip, which is a semiconductor device, are transferred to other constituent elements of the semiconductor device is described. The semiconductor device includes a non-volatile memory unit 410, a first shift register unit 420_A including a plurality of first registers 420_A_0 to 420_A_N, a second shift register unit 420_B including a plurality of second registers 420_B_0 to 420_B_N, a verification unit 430, a first internal circuit 440_A, and a second internal circuit 440_B. The first internal circuit 440_A uses the data stored in the first shift register unit 420_A, and the second internal circuit 440_B uses the data stored in the second shift register unit 420_B.

The non-volatile memory unit 410 stores data to be transferred to the first shift register unit 420_A and the second shift register unit 420_B. The data are transferred from the non-volatile memory unit 410 to the first shift register unit 420_A and the second shift register unit 420_B through a data line DATA LINE. A clock CLK is outputted from the non-volatile memory unit 410. The clock CLK is synchronized with the data transferred through the data line DATA LINE. The non-volatile memory unit 410 may be formed to include an e-fuse array or it may be formed of a non-volatile memory device, such as a flash memory device and an Electrically Erasable Programmable Read-Only Memory (EEPROM) device.

First registers 420_A_0 to 420_A_N of the first shift register unit 420_A are serially coupled with each other as a shift register, and they shift and store the data transferred through the data line DATA LINE in synchronization with the clock CLK. Each of the first registers 420_A_0 to 420_A_N may be a D-flipflop.

The first internal circuit 440_A is a circuit that uses the data stored in the first registers 420_A_0 to 420_A_N for performing an internal operation of the semiconductor device.

Second registers 420_B_0 to 420_B_N of the second shift register unit 420_B are serially coupled with each other as a shift register, and shift and store the data transferred from the last register 420_A_N of the first shift register unit 420_A in synchronization with the clock CLK. Each of the second registers 420_B_0 to 420_B_N may be a D-flipflop. Although the second shift register unit 420_B is disposed apart from the first shift register unit 420_A, the first shift register unit 420_A and the second shift register unit 420_B substantially form one shift register unit.

The second internal circuit 440_B is a circuit that uses the data stored in the second registers 420_B_0 to 420_B_N for performing an internal operation of the semiconductor device.

The verification unit 430 receives the data outputted from the last second register 420_B_N of the second shift register unit 420_B and verifies whether the data outputted from the non-volatile memory unit 410 are normally transferred to the first shift register unit 420_A and the second shift register unit 420_B.

As shown in FIG. 5, although the first internal circuit 440_A and the second internal circuit 440_B that use the data stored in the non-volatile memory unit 410 are disposed in different portions of the semiconductor device, the first registers 420_A_0 to 420_A_N and the second registers 420_B_0 to 420_B_N where the data used by the first internal circuit 440_A and the second internal circuit 440_B are stored may form one shift register unit.

Figure 6:
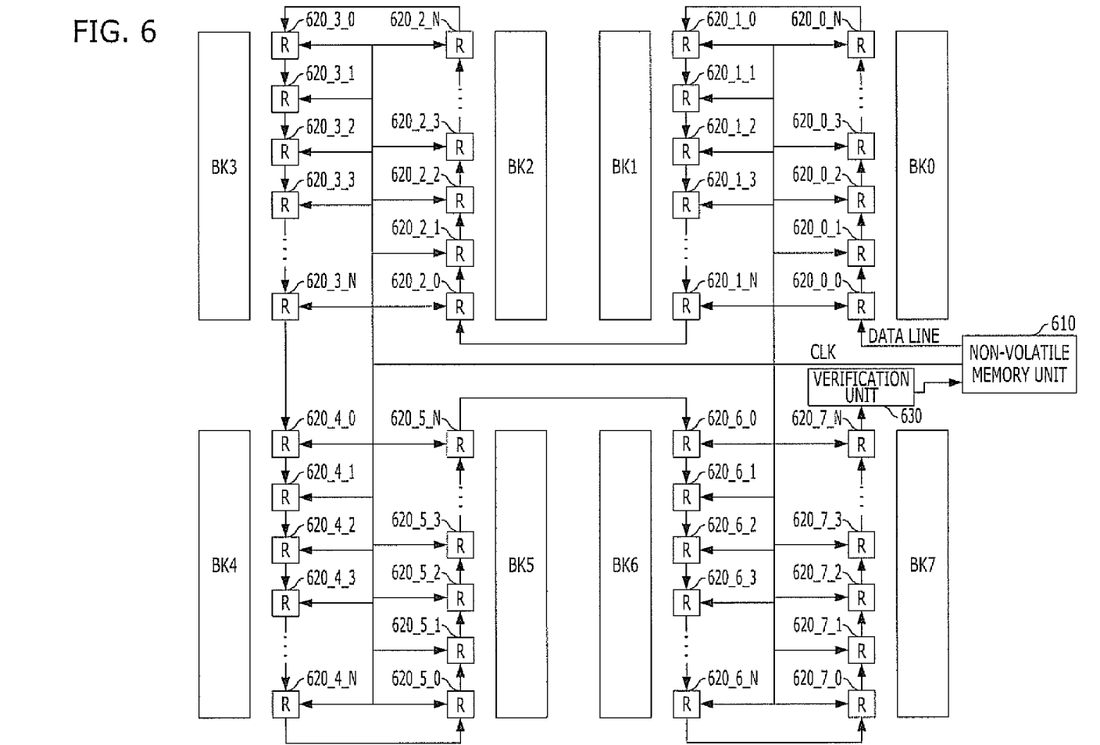
FIG. 6 is a block diagram illustrating a semiconductor memory device in accordance with an exemplary embodiment of the present invention.

FIG. 6 is a block diagram showing a semiconductor memory device in accordance with an exemplary embodiment of the present invention. The drawing is an explanatory diagram illustrating the scheme in FIG. 5 applied to a memory device. Referring to FIG. 6, the memory device includes a non-volatile memory unit 610, a plurality of first registers 620_0_0 to 620_0_N to a plurality of eighth registers 620_7_0 to 620_7_N, first to eighth memory banks BK0 to BK7, and a verification unit 630.

The non-volatile memory unit 610 stores repair data of the first to eighth memory banks BK0 to BK7, that is, the addresses of failure cells. The non-volatile memory unit 610 transfers data through a data line DATA LINE. A clock CLK is outputted from the non-volatile memory unit 610. The clock CLK is synchronized with the data of the data line DATA LINE. The non-volatile memory unit 610 may be formed to include an e-fuse array, or it may be formed of a non-volatile memory device, such as a flash memory device and an Electrically Erasable Programmable Read-Only Memory (EEPROM) device.

The first registers 620_0_0 to 620_0_N to the eighth registers 620_7_0 to 620_7_N store repair information corresponding them, respectively. For example, a plurality of second registers 620_1_0 to 620_1_N store repair information of the second memory bank BK1, and a plurality of sixth registers 620_5_0 to 620_5_N store repair information of the sixth memory bank BK5. The first registers 620_0_0 to 620_0_N to the eighth registers 620_7_0 to 620_7_N form one shift register unit, and shift and store the data transferred through the data line DATA LINE in synchronization with the clock CLK.

The first to eighth memory banks BK0 to BK7 perform a repair operation based on repair data that are stored in the corresponding registers. Each of the first to eight memory banks BK0 to BK7 may be formed of a Dynamic Random Access Memory (DRAM) cell array or a flash cell array.

The verification unit 630 receives the data outputted from the last register 620_7_N among the eighth registers 620_7_0 to 620_7_N that correspond to the eighth memory bank BK7, and checks whether the data outputted from the non-volatile memory unit 610 are normally transferred to the first registers 620_0_0 to 620_0_N to the eighth registers 620_7_0 to 620_7_N.

Referring to FIG. 6, the repair information of all the memory banks BK0 to BK7 of the memory device may be stored in the non-volatile memory unit 610 and the repair informations are efficiently transferred to the first registers 620_0_0 to 620_0_N to the eighth registers 620_7_0 to 620_7_N that are respectively included in the first to eighth memory banks BK0 to BK7 during the initialization operation of the memory device.

The repair informations stored in the registers may be row repair informations or column repair informations. Also, the repair informations stored in the registers may include both row repair informations and column repair informations.

According to an embodiment of the present invention, data are efficiently transferred from a non-volatile memory unit in the inside of a semiconductor device to other circuits in the semiconductor device that require the data of the non-volatile memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a non-volatile memory unit;
   a data line configured to transfer data sequentially outputted from the non-volatile memory unit, wherein the data has a predetermined data pattern in an initial stage;
   a shift register unit including a plurality of registers that shift and store the data transferred through the data line in synchronization with a clock; and
   a verification unit configured to check the predetermined data pattern outputted from a last register of the shift register unit.

2. The semiconductor device of claim 1, wherein when the verification unit determines that the predetermined data pattern is outputted from the last register, data transfer from the non-volatile memory unit to the shift register unit is stopped, and
   when the verification unit determines that the predetermined data pattern is not outputted from the last register, the data transfer from the non-volatile memory unit to the shift register unit is performed again.

3. The semiconductor device of claim 1, wherein the clock is synchronized with the data transferred through the data line.

4. The semiconductor device of claim 1, wherein each of the registers comprises a D-flipflop.

5. The semiconductor device of claim 1, further comprising:
   an internal circuit configured to use the data stored in the shift register unit.

6. The semiconductor device of claim 1, wherein the data line includes a number of data lines and the shift register unit includes the number of the shift register units, wherein each data line is coupled to a corresponding shift register unit.

7. A semiconductor device, comprising:
   a non-volatile memory unit;
   a data line configured to transfer data sequentially outputted from the non-volatile memory unit;
   a plurality of first registers configured to store data;
   a first internal circuit configured to use the data stored in the first registers;
   a plurality of second registers configured to store data;
   a second internal circuit configured to use the data stored in the second registers, wherein the first registers and the second registers are coupled in a form of a shift register unit and shift and store the data transferred through the data line in synchronization with a clock; and
   a verification unit configured to check the predetermined data pattern that is outputted from a last second register among the second registers.

8. The semiconductor device of claim 7, wherein when the verification unit determines that the predetermined data pattern is outputted from the last second register, data transfer from the non-volatile memory unit to the plurality of first registers and the plurality of second registers is stopped, and
   when the verification unit determines that the predetermined data pattern is not outputted from the last register, the data transfer from the non-volatile memory unit to the plurality of first registers and the plurality of second registers is performed again.

9. The semiconductor device of claim 7, wherein the clock is synchronized with the data transferred through the data line.

10. A semiconductor memory device, comprising:
    a non-volatile memory unit configured to store repair data;
    a data line configured to transfer data sequentially outputted from the non-volatile memory unit, wherein the data has a predetermined data pattern in an initial stage;
    a plurality of first registers to a plurality of $N^{th}$ registers configured to store data, wherein the first registers to the $N^{th}$ registers are coupled in a form of a shift register unit and shift and store the data transferred through the data line in synchronization with a clock; and
    first to $N^{th}$ memory banks configured to replace a normal memory cell with a redundancy memory cell by using the data stored in the registers that correspond to the corresponding memory bank among the first registers to the $N^{th}$ registers; and
    a verification unit configured to check the predetermined data pattern that is outputted from a last $N^{th}$ register among the $N^{th}$ registers.

11. The semiconductor memory device of claim 10, wherein when the verification unit determines that the predetermined data pattern is outputted from the last $N^{th}$ register, data transfer from the non-volatile memory unit to the first registers to the $N^{th}$ registers is stopped, and
    when the verification unit determines that the predetermined data pattern is not outputted from the last $N^{th}$ register, the data transfer from the non-volatile memory unit to the first registers to the $N^{th}$ registers is performed again.

12. The semiconductor memory device of claim 10, wherein the clock is synchronized with the data transferred through the data line.

13. The semiconductor memory device of claim 10, wherein the non-volatile memory unit comprises an e-fuse array, and
    each of the first to $N^{th}$ memory banks comprises a Dynamic Random Access Memory (DRAM) cell array.

* * * * *